(12) United States Patent
Amasuga et al.

(10) Patent No.: US 7,342,453 B2
(45) Date of Patent: Mar. 11, 2008

(54) CASCODE CIRCUIT

(75) Inventors: Hirotaka Amasuga, Tokyo (JP);
Takayuki Matsuzuka, Tokyo (JP);
Akira Inoue, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 127 days.

(21) Appl. No.: 11/446,201

(22) Filed: Jun. 5, 2006

(65) Prior Publication Data

US 2007/0040226 A1 Feb. 22, 2007

(30) Foreign Application Priority Data

Aug. 22, 2005 (JP) .............................. 2005-239524

(51) Int. Cl.
*H03F 3/16* (2006.01)
*H03F 1/22* (2006.01)

(52) U.S. Cl. ....................................... 330/277; 330/311

(58) Field of Classification Search ................. 330/311
See application file for complete search history.

(56) References Cited

U.S. PATENT DOCUMENTS 5,304,946 A * 4/1994 Sano et al. .................. 330/254
7,126,427 B2 * 10/2006 Aoki ........................... 330/311
2005/0007200 A1 1/2005 Inoue et al.

FOREIGN PATENT DOCUMENTS

JP 2005-033650 2/2005

* cited by examiner

*Primary Examiner*—Steven J. Mottola
(74) *Attorney, Agent, or Firm*—Leydig, Voit & Mayer, Ltd.

(57) ABSTRACT

A cascode circuit in which two field effect transistors ("FET") are connected in cascode has a first FET having its source grounded, a second FET having its source connected to the drain of the first FET, and a Schottky barrier diode having an anode connected to the source of the first FET and a cathode connected to the gate of the second FET.

8 Claims, 8 Drawing Sheets

CASCODE CIRCUIT

BACKGROUND OF THE INVENTION

1. Field of the Invention

The present invention relates to a cascode circuit used mainly in a radiofrequency band of 800 MHz or higher.

2. Background Art

A cascode circuit in which two field effect transistors (hereinafter referred to as "FET") having a Schottky junction gate are connected in cascode form is used in a radiofrequency amplifier circuit used in a radiofrequency band.

FIG. 11 is a circuit diagram showing a conventional cascode circuit. The cascode circuit has a first FET 1 having its source grounded, a second FET 2 having its source connected to the drain of the first FET 1, a capacitor 3 connected between the source of the first FET 1 and the gate of the second FET 2, a resistor 4 connected between the drain of the second FET 2 and the gate of the second FET 2, and a resistor 5 connected parallel to the capacitor 3 between the source of the first FET 1 and the gate of the second FET 2.

The capacitance C1 of the capacitor 3 and the resistance values R1 and R2 of the resistors 4 and 5 for determining the gate voltage of the second FET 2 are optimized to double the withstand voltage in comparison with an arrangement using a single FET and to obtain an output and a gain about twice as high as those in the case of the arrangement using a single FET (see, for example, Japanese Patent Laid-Open No. 2005-33650).

It is effective to adopt a microwave monolithic IC (MMIC) in which circuit elements including resistors, capacitors and matching lines are simultaneously fabricated, in reducing the cost and the circuit loss in a radiofrequency band of several GHz or higher. In conventional cascode circuits, therefore, a metal-insulator-metal (MIM) capacitor is used as capacitor 3.

FIG. 12 is a sectional view of a MIM structure, and FIG. 13 is a plan view of the MIM structure. An interwiring insulating film 7 of $SiO_2$ or $SiN_x$ is formed between a piece of lower substratum wiring 6 and a piece of upper substratum wiring 8 formed over a semiconductor substrate 5. One end of the piece of upper substratum wiring 8 is grounded while one end of the piece of lower substratum wiring 6 is connected to the gate of the second FET 2.

Each resistor is formed as an implanted resistor or an epitaxial resistor by placing the active layer of the transistor in line form. FIG. 14 is a perspective view of an epitaxial resistor. A Schottky layer 12 is formed on a channel 11 and a high-concentration-doped semiconductor layer 13 high-concentration doped to be an n-type layer in ohmic contact is formed on the Schottky layer 12. The resistance value of the high-concentration-doped semiconductor layer 13 is determined the coping concentration of the doped layer. The sheet resistance of the concentration-doped semiconductor layer 13 is ordinarily low, about 100 $\Omega/\square$.

It is known that the optimum value of the capacitance value C1 of the capacitor 3 is as expressed by the following expression:

$$C1 = \frac{Cgs}{\frac{1}{2}gmRL - 1} \quad \text{(Formula 1)}$$

where Cgs is the gate-source capacitance, gm is the mutual conductance, and RL is an external load (fixed). Of these parameters, those varying due to variations in the active layer of the transistor are Cgs and gm. Cgs is determined generally by the depletion layer width during operation, while gm correlates with the sheet concentration Ns and pinch off voltage Vp of the active layer as well as the depletion layer width.

Causes of variations in transistor characteristics include variations in operating layer forming processes such as an implantation process and an epitaxial layer lamination process, and variations in device forming processes such as a gate forming process and a surface treatment process. In ordinary cases, the latter causes are dominant and the amounts of variation due to the latter causes are larger. In particular, when a gate is formed, Schottky characteristic parameters including the Schottky barrier potential difference $\Phi b$ change easily depending on process conditions, because the Schottky junction is process-sensitive. The influence of the Schottky characteristic parameters on the transistor characteristics is considerably large.

Table 1 shows the results of simulation of gm and Cgs with respect to the value of $\Phi b$.

TABLE 1

| $\Phi b$ | gm | Cgs |
|---|---|---|
| 0.75 eV | 0.36 S/mm | 12 pF |
| 0.55 eV | 0.36 S/mm | 10 pF |

These parameters were computed by device simulation based on a low-noise high electron mobility transistor (HEMT) structure while the gate width Wg was set to 1 mm; the gate source voltage Vgs to −0.3 V; and the drain voltage Vd to 2 V. At the voltage Vgs=−0.3 V, gm is generally at its maximum. Vgs=−0.3 V and Vd=2 V are voltage regions ordinarily used in high-gain low-noise HEMTs.

From the simulation results shown above, it can be understood that when $\Phi b$ is changed, only Cgs changes and the change in gm is substantially zero. From the results and Formula 1, the optimum capacitance value of C1 changes in correspondence with Cgs. However, the value of the MIM capacitor does not change in correspondence with Cgs. Therefore there is a problem that in a case where the optimum value of C1 varies due to variations in Cgs on a wafer plane, among wafers or among lots, the value of the MIM capacitor becomes different from the optimum value of C1.

Forming a piece of lower substratum wiring, interwiring insulating film and a piece of upper substratum wiring is required to form the MIM capacitor, and each of the processes of forming the wiring and film includes a transfer step. Therefore an increased number of masks are required and there is a possibility of the number of process steps being increased to several tens or more. In forming the MIM capacitor, there is a need to increase the thickness of interwiring insulating film to about several hundred nm in order to stabilize the capacitance value. If the thickness is increased, the interwiring distance is increased and the capacitance value per area is reduced. A need then arises to increase the pattern area. From this need, the chip area is increased and the number of chips per wafer is reduced, resulting in an increase in manufacturing cost.

SUMMARY OF THE INVENTION

In view of the above-described problems, an object of the present invention is to provide a cascode circuit in which variation from the optimum operating capacitance is limited, and which can be manufactured at a reduced cost.

According to one aspect of the present invention, a cascode circuit in which two field effect transistors (hereinafter referred to as "FET") are connected in cascode form has a first FET having its source grounded, a second FET having its source connected to the drain of the first FET, and a Schottky barrier diode having its anode connected to the source of the first FET and its cathode connected to the gate of the second FET.

According to the present invention, a Schottky barrier diode is used as a capacitor to enable the capacitor to be formed by using an active layer formed in the proximity of the transistor simultaneously with the formation of the transistor. Accordingly, the capacitance C1 changes in the same direction as Cgs of the transistor with respect to concentration variation in the active layer. Therefore variation from the optimum operating capacitance can be limited.

The Schottky barrier diode can also be formed in the transistor forming process. Therefore the number of process steps is not increased. The depletion layer of the Schottky barrier diode corresponding to the interwiring insulting film of the MIM capacitor is smaller in thickness than the interwiring insulting film, so that the pattern area can be reduced. Consequently, the manufacturing cost can be reduced.

Other and further objects, features and advantages of the invention will appear more fully from the following description.

DETAILED DESCRIPTION OF THE PREFERRED EMBODIMENTS

First Embodiment

Figure 1:
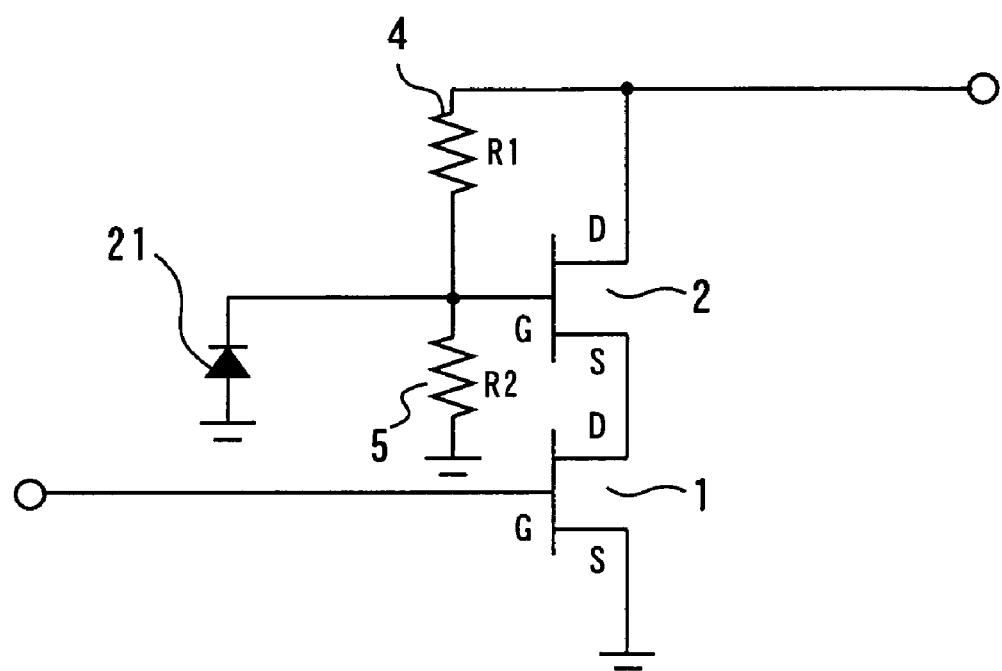
FIG. 1 is a circuit diagram showing a cascode circuit according to a first embodiment of the present invention.

A cascode circuit according to a first embodiment of the present invention is a cascode circuit in which two field effect transistors (hereinafter referred to as "FET") are connected in cascode form. The cascode circuit has, as shown in FIG. 1, a first FET 1 having its source grounded, a second FET 2 having its source connected to the drain of the first FET 1, a Schottky barrier diode 21 having its anode connected to the source of the first FET 1 and its cathode connected to the gate of the second FET 2, a resistor 4 (first resistor) connected between the drain of the second FET 2 and the gate of the second FET 2, and a resistor 5 (second resistor) connected parallel to the Schottky barrier diode 21 between the source of the first FET 1 and the gate of the second FET 2. The gate of the first FET 1, the source of the first FET 1 and the drain of the second FET 2 function as a gate, a source and a drain, respectively, of the cascode circuit.

Figure 2:
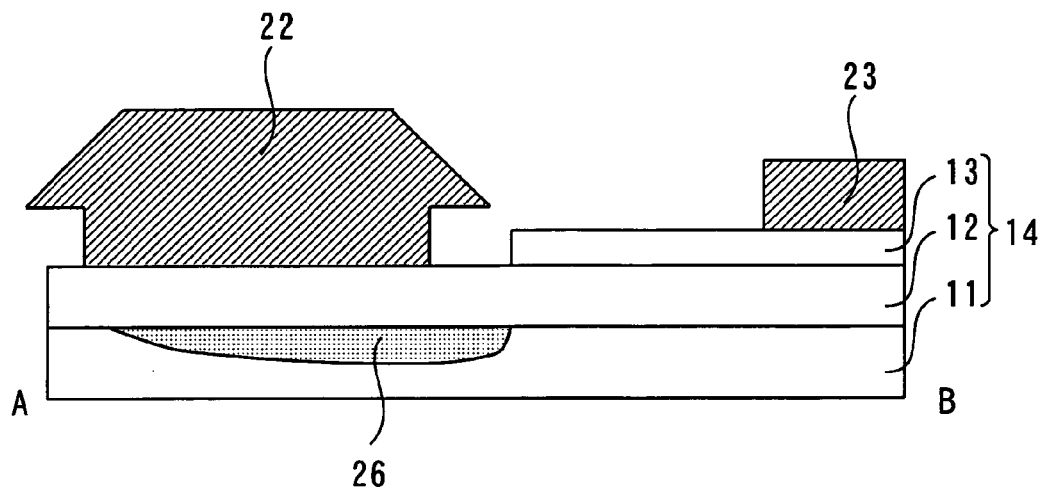
FIG. 2 is a sectional view showing a Schottky barrier diode in the cascode circuit according to the first embodiment of the present invention.
Figure 3:
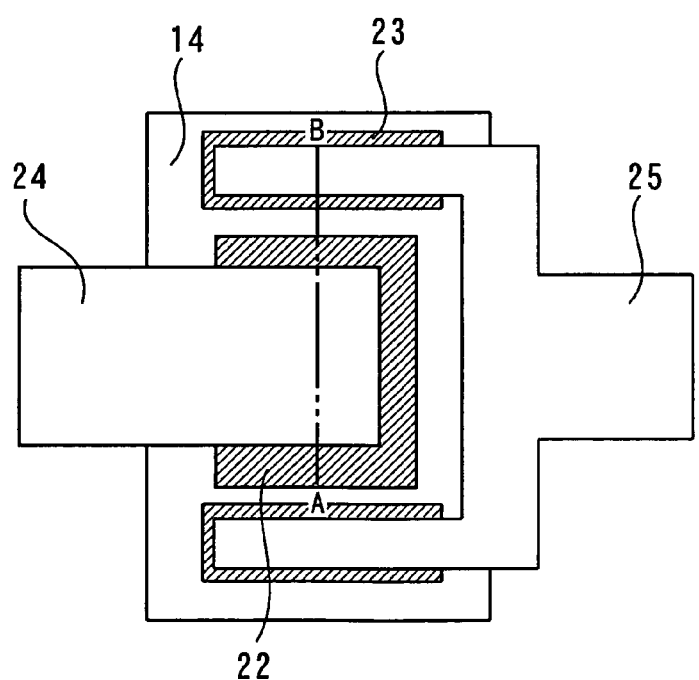
FIG. 3 is a plan view showing the Schottky barrier diode in the cascode circuit according to the first embodiment of the present invention.

FIG. 2 is a sectional view showing the Schottky barrier diode of the cascode circuit according to the first embodiment of the present invention. FIG. 3 is a plan view of the Schottky barrier diode. A channel 11 is formed on a semiconductor substrate (not shown). A Schottky layer 12, which is an n-type semiconductor layer, is formed on the channel 11. A high-concentration-doped semiconductor layer 13, which is an $n^+$-type semiconductor layer, is formed on the Schottky layer 12. The channel 11, the Schottky layer 12 and the high-concentration-doped semiconductor layer 13 form an active layer 14. These layers forming the active layer are formed by epitaxial growth on the semiconductor substrate or by doping the semiconductor substrate with impurities.

An anode 22 is Schottky-joined onto the Schottky layer 12. A cathode 23 is ohmic-joined onto the high-concentration-doped semiconductor layer 13. The anode 22 is formed on the source (ground) side in the entire circuit and is grounded via a piece of wiring 24. The cathode 23 is formed at a certain distance from the anode 22 and is connected to the gate of the second FET 2 via a piece of wiring 25.

Cgs is determined by the shape of a depletion layer 26 extending in the channel 11. The shape of the depletion layer 26 depends mainly on the design of the active layer and depends on the configuration of the planar pattern to some degree. The desired initial capacitance can be obtained by adjusting the area of the anode 22.

In the cascode circuit according to this embodiment, a capacitance can be produced by using the active layer formed in the proximity of the transistor simultaneously with the formation of the transistor. Accordingly, the capacitance C1 of the Schottky barrier diode 21 changes in the same direction as Cgs of the transistor with respect to concentration variation in the active layer. Therefore variation in C1 from the optimum value can be limited.

Also, the anode can be formed simultaneously with the formation of the gate of the transistor and the cathode can be formed simultaneously with the formation of the source and drain. Thus, the Schottky barrier diode can be formed in the transistor forming process. The number of process steps is not increased. The combination of the depletion layer in the Schottky layer 12 of the Schottky barrier diode and the depletion layer 26 in the channel 11 corresponds to the interwiring insulating film of a MIM capacitor. However, the combination of the depletion layers is smaller in thickness than the interwiring insulating film. Therefore the pattern area can be reduced. Consequently, the manufacturing cost can be reduced.

The Schottky layer 12 may be removed. In such a case, the depletion layer extends immediately from the Schottky junction. The present invention can also be applied to a cascode circuit in which n (a positive integer equal to or larger than 3) number of FETs are connected in cascode form. The cascode circuit in such a case has a first FET having its source grounded, an mth FET (m: a positive integer in the range from 2 to n) having its source connected to the drain of the (m−1)th FET, and an (m−1)th Schottky barrier diode having its anode connected to the source of the first FET and its cathode connected to the gate of the mth FET.

Second Embodiment

Figure 4:
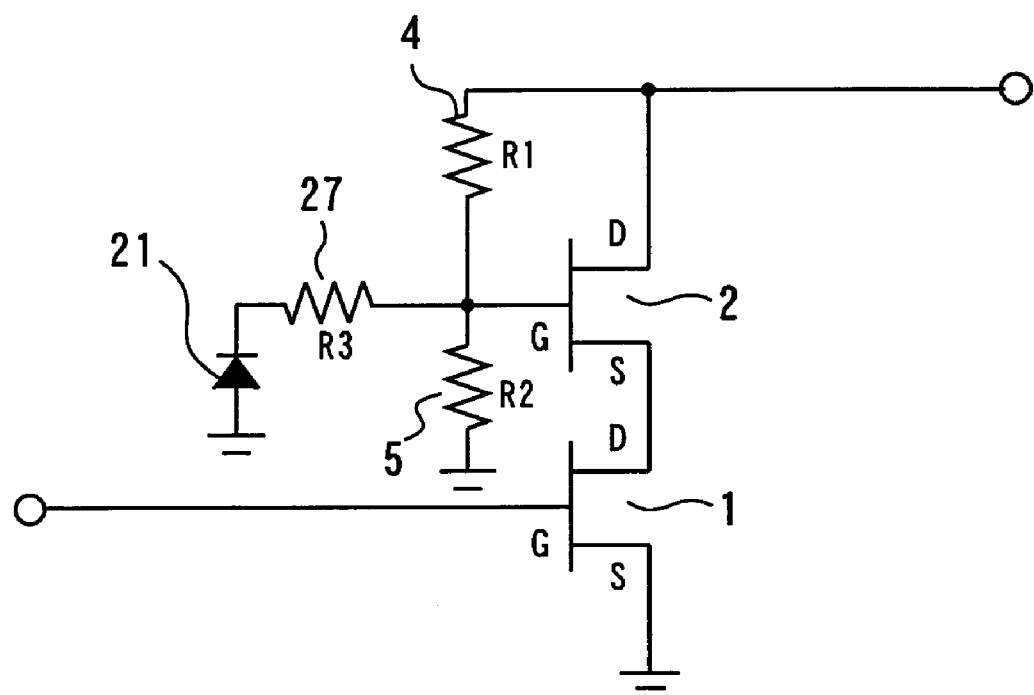
FIG. 4 is a circuit diagram showing a cascode circuit according to a second embodiment of the present invention.

FIG. 4 is a circuit diagram showing a cascode circuit according to a second embodiment of the present invention. This circuit has the same components of the first embodiment and a resistor 27 connected in series with the Schottky barrier diode 21. The provision of the resistor 27 ensures that the operation of the cascode circuit is stabilized.

Figure 5:
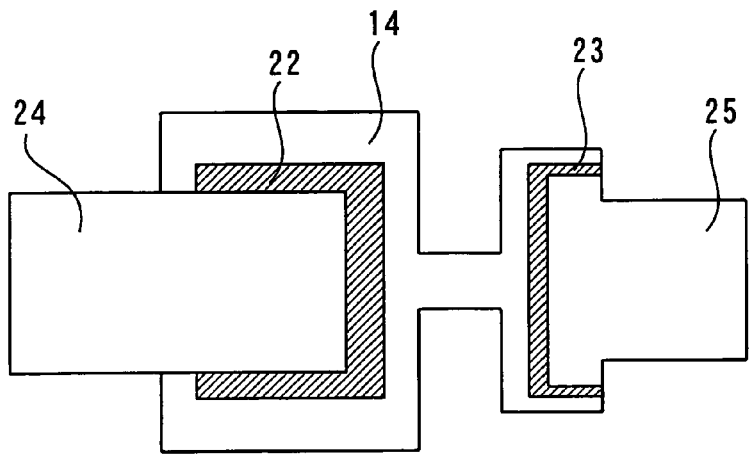
FIG. 5 is a plan view showing a Schottky barrier diode in the cascode circuit according to the second embodiment of the present invention.

FIG. 5 is a plan view of the Schottky barrier diode in the cascode circuit according to the second embodiment of the present invention. Components identical or corresponding to those shown in FIG. 3 are indicated by the same reference numerals and the description for them will not be made. The width of the active layer 14 is reduced between the anode 22 and the cathode 23 in contrast with that in the first embodiment. An epitaxial resistor is thereby formed as the resistor 27 connected in series with the Schottky barrier diode 21. The resistance value R3 of the resistor 27 depends on the shape of the constriction of the active layer 14.

Third Embodiment

Figure 6:
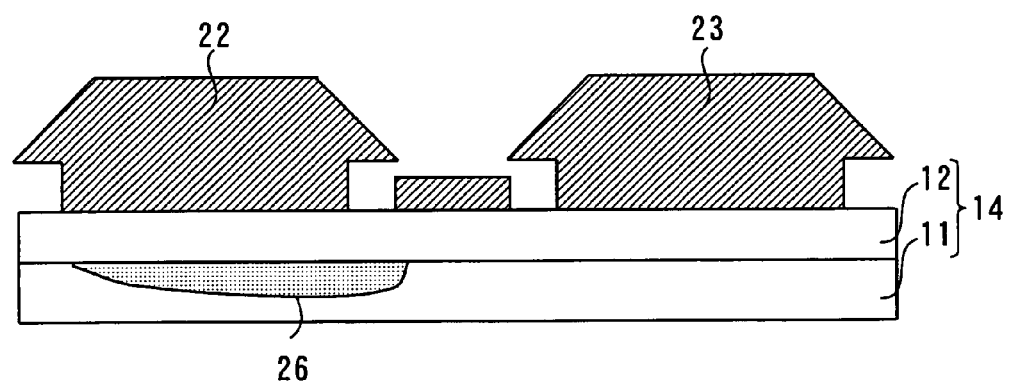
FIG. 6 is a sectional view showing a Schottky barrier diode in a cascode circuit according to a third embodiment of the present invention.
Figure 7:
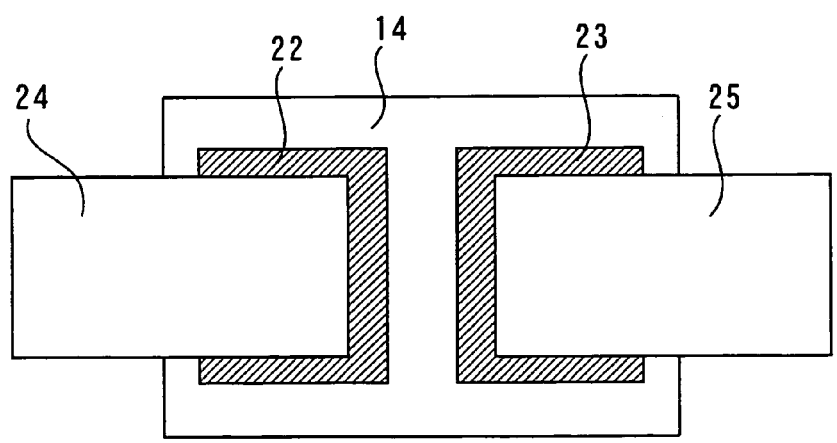
FIG. 7 is a plan view showing the Schottky barrier diode in the cascode circuit according to the third embodiment of the present invention.

FIG. 6 is a sectional view showing a Schottky barrier diode in a cascode circuit according to a third embodiment of the present invention. FIG. 7 is a plan view of the Schottky barrier diode. This Schottky barrier diode has a cathode 23 Schottky-joined onto the Schottky layer 12. That is, two Schottky barrier diodes in opposite directions are connected in series with each other by Schottky-joining the cathode 23 onto the active layer instead of ohmic-joining the cathode 23 as in the first embodiment.

When the potential on the semiconductor side is higher than that on the electrode side in the Schottky junction, the Schottky junction has substantially no current flowing therethrough and functions as a capacitor by a depletion layer. In contrast, when the potential on the electrode side is higher than that on the semiconductor side, the Schottky junction functions as a resistor by having a large forward current. Therefore the cathode 23 Schottky-joined onto the Schottky layer 12 functions as the resistor 27 connected in series with the Schottky barrier diode 21. The resistance value R3 of this resistor 27 depends on the area of the cathode 23.

Fourth Embodiment

Figure 8:
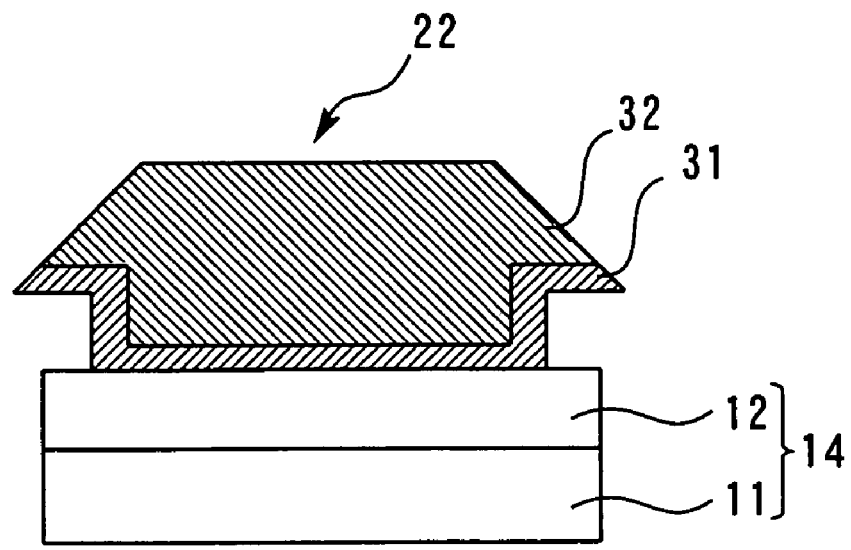
FIG. 8 is a sectional view showing a Schottky barrier diode in a cascode circuit according to a fourth embodiment of the present invention.

FIG. 8 is a sectional view showing a Schottky barrier diode in a cascode circuit according to a fourth embodiment of the present invention. An anode 22 is constituted by a high-resistance metal film 31 Schottky-joined onto the Schottky layer 12 and a low-resistance metal film 32 formed on the high-resistance metal film 31.

The arrangement may alternatively be such that the anode 22 is formed by inserting a high-resistance metal film or a thin insulating film in a low-resistance metal film or is formed only of a high-resistance metal film. That is, the anode 22 has at least as its portion a film formed of a material having a resistance value higher than those of the materials forming the source and the drain of the first FET 1 and the second FET 2.

The high-resistance metal film 31 functions as the resistor 27 connected in series with the Schottky barrier diode 21. The resistance value R3 of the high-resistance metal film 31 is determined by the resistivity, film thickness and shape of the high-resistance metal film 31.

Fifth Embodiment

There is a temperature rise problem with a high-output amplifier made by using a radiofrequency FET. Low-resistance metals such as Au, Ag and Cu are ordinarily low in high-temperature reliability and react comparatively easily with the semiconductor layer. For this reason, a high-resistance metal such as tungsten having high high-temperature reliability is inserted as a barrier metal between the semiconductor layer and the low-resistance metal layer. In such a case, the barrier metal contacts the semiconductor layer to form a Schottky junction. The resistivity of metals generally used as a barrier metal is high. However, a plurality of layers of a low-resistance metal are laid one on another to reduce the resistance and improve the transistor characteristics.

Figure 9:
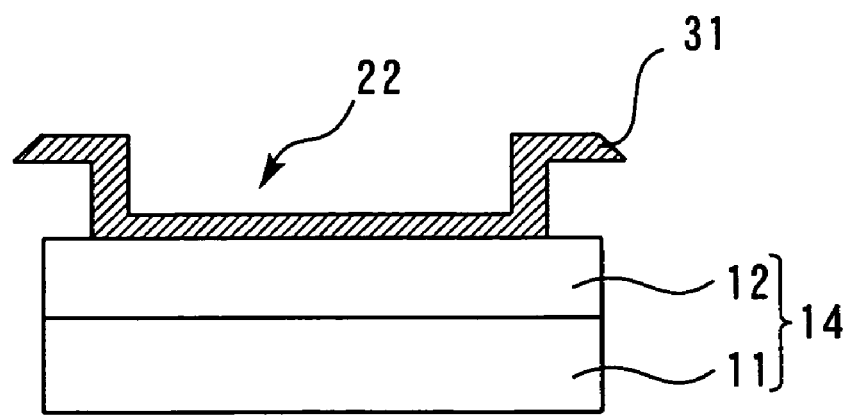
FIG. 9 is a sectional view showing a Schottky barrier diode in a cascode circuit according to a fifth embodiment of the present invention.

In this embodiment, high-resistance metal film 31 Schottky-joined onto the Schottky layer 12 as shown in FIG. 8 and low-resistance metal film 32 lower in resistance than the high-resistance metal film 31 and provided on the high-resistance metal film 31 are first formed by the same process as that for forming the gates of the first FET 1 and the second FET 2. Thereafter, the whole or part of the low-resistance metal film 32 is removed to form the anode 22, as shown in FIG. 9. The high-resistance metal film 31 functions as the resistor 27 connected in series with the Schottky barrier diode 21.

Sixth Embodiment

If the resistance value of the resistors 4 and 5 shown in FIG. 1 is low, a large bypass current flows and the efficiency is considerably low. In ordinary cases, therefore, it is necessary that the resistance value of the resistors 4 and 5 be 1 kΩ or higher. If the resistors 4 and 5 are formed as epitaxial or implanted resistors, the sheet resistance is low and, therefore, it is necessary to increase the length of the resistors in order to ensure a sufficiently high resistance value. A problem then arises that the chip size is increased and the manufacturing cost is increased.

Figure 10:
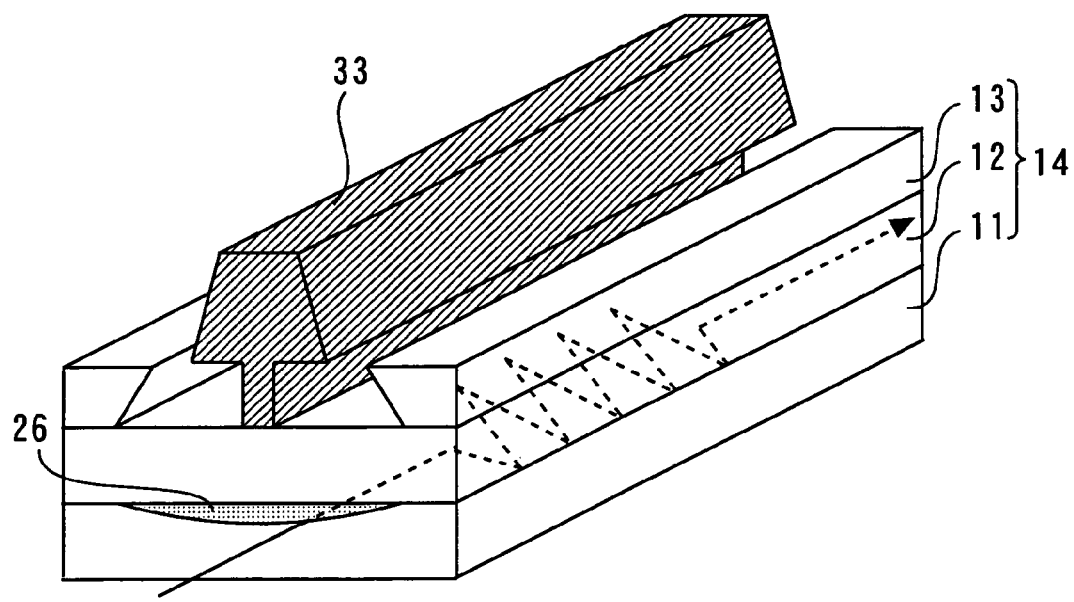
FIG. 10 is a perspective view showing a resistor in a cascode circuit according to a sixth embodiment of the present invention.
Figure 11:
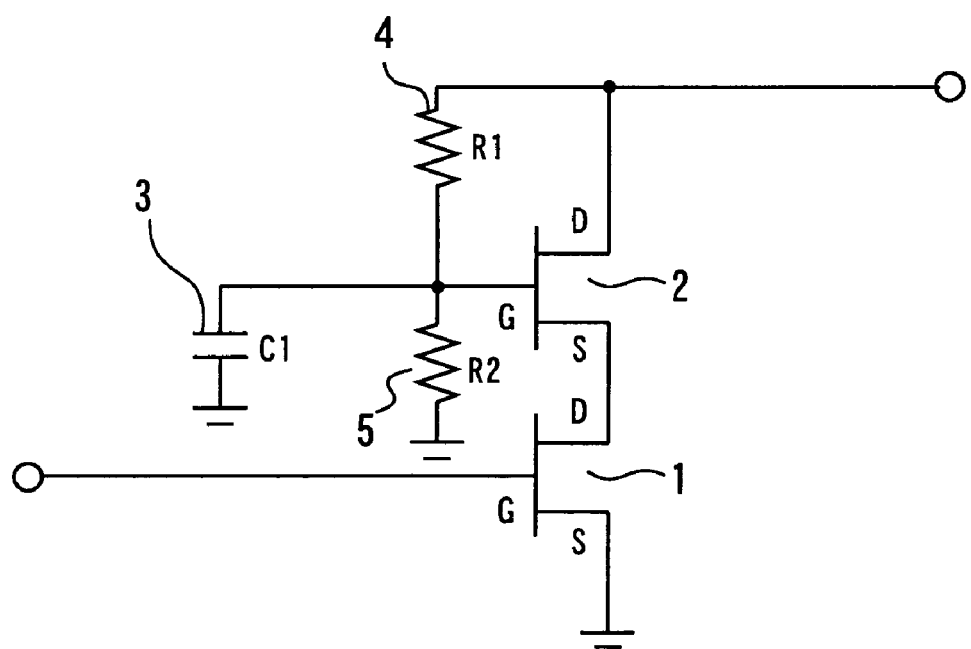
FIG. 11 is a circuit diagram showing a conventional cascode circuit.
Figure 12:
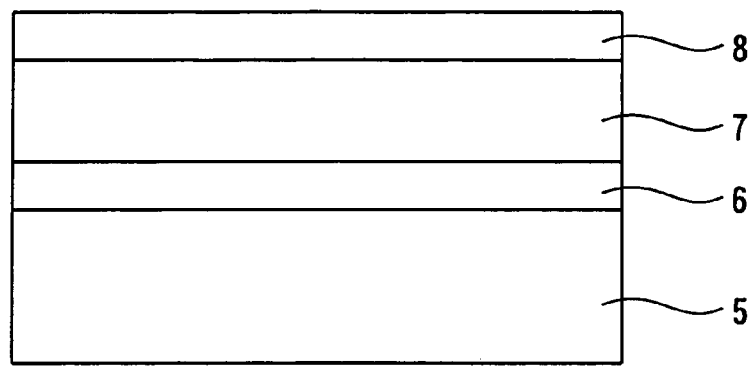
FIG. 12 is a sectional view showing a MIM structure.
Figure 13:
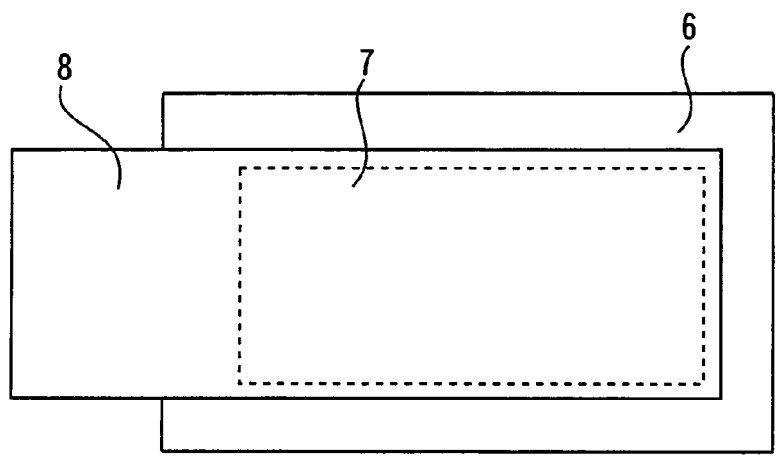
FIG. 13 is a plan view showing the MIM structure.
Figure 14:
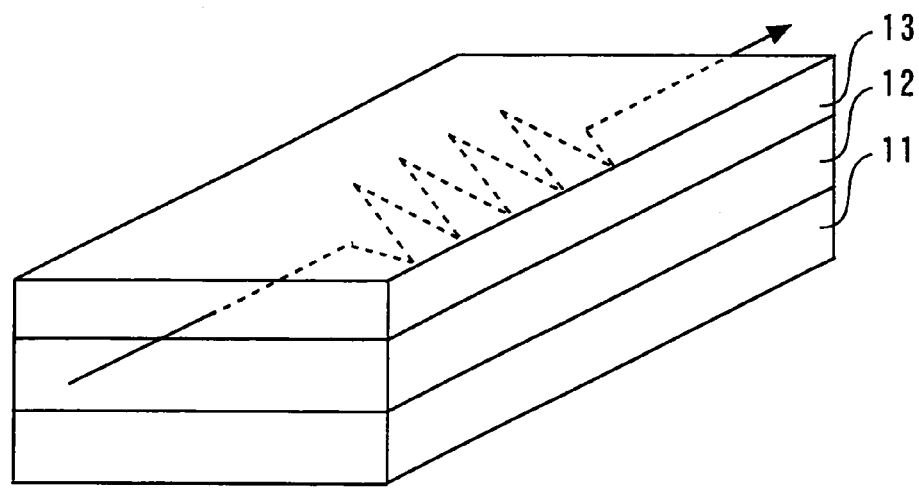
FIG. 14 is a perspective view showing an epitaxial resistor.

In this embodiment, the resistors 4 and 5 are formed by removing portions of the high-concentration-doped semiconductor layer 13 formed on the channel 11 and containing an impurity at a higher concentration in comparison with the channel 11, as shown in FIG. 10.

If portions of the high-concentration-doped semiconductor layer 13 are removed as described above, a great part of the current flows through the channel 11 and, therefore, the sheet resistance value can be remarkably increased (about 10 times higher). Correspondingly, the net resistor length can be reduced to about 1/10, thus effectively limiting the increase in chip size.

A gate 33 is formed as shown in FIG. 10. However, FIG. 10 shows an example of a case where the gate 33 is necessarily formed for a reason relating to the process flow. The gate 33 may be removed. In the case where the gate 33 is formed, a current flow flows through the gate 33 if the gate 33 couples with the electrodes at both ends of the resistor. Therefore it is necessary that the gate 33 be floating.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2005-239524, filed on Aug. 22, 2005 including specification, claims, drawings and summary, on which the Convention priority of the present application is based, are incorporated herein by reference in its entirety.

What is claimed is:

1. A cascode circuit in which two field effect transistors ("FET") are connected in cascode, the cascode circuit comprising:
   a first FET having a source and a drain, with the source grounded;
   a second FET having a source, a gate, and a drain, with the source connected to the drain of the first FET; and
   a Schottky barrier diode having an anode connected to the source of the first FET and a cathode connected to the gate of the second FET.

2. A cascode circuit comprising:
   n (n: a positive integer equal to or larger than 3) FETs, the FETs having respective sources, gates, and drains, and being connected in cascode, the cascode circuit including:
      a first FET having a source and a drain, with the source grounded;
      an mth FET (m: a positive integer in the range from 2 to n) having its source connected to the drain of the (m−1)th FET; and
      a Schottky barrier diode having an anode connected to the source of the first FET and a cathode connected to the gate of the mth FET.

3. The cascode circuit according to claim 2, wherein the Schottky barrier diode has an anode forming a Schottky junction with an active layer, and a cathode ohmically contacting the active layer.

4. The cascode circuit according to claim 3, wherein the active layer has a width that is narrowed between the anode and the cathode.

5. The cascode circuit according to claim 2, wherein the Schottky barrier diode has an anode forming a Schottky junction with an active layer, and a cathode forming a Schottky junction with the active layer.

6. The cascode circuit according to claim 3, wherein the anode includes at least a portion of a film of a material having a resistance higher than resistances of the materials forming the source and the drain of the first FET and the second FET.

7. The cascode circuit according to claim 3, wherein the anode is formed by a process in which a high-resistance metal film forming a Schottky junction with the active layer and a low-resistance metal film, lower in resistance than the high-resistance metal film, is on the high-resistance metal film, are formed by the same process as forming the gates of the first FET and the second FET, and at least part of the low-resistance metal film is thereafter removed.

8. The cascode circuit according to claim 1, further comprising a first resistor connected between the drain of the second FET and the gate of the second FET, and a second resistor connected in parallel with the Schottky barrier diode, between the source of the first FET and the gate of the second FET, wherein the first and second resistors are formed by removing portions of a high-concentration-doped semiconductor layer located on a channel and containing a dopant impurity in a higher concentration than the channel.

* * * * *